(12) United States Patent
Lesso et al.

(10) Patent No.: US 12,665,561 B2
(45) Date of Patent: ***Jun. 23, 2026

(54) METHODS AND SYSTEMS FOR EQUALISATION

(71) Applicant: Cirrus Logic International Semiconductor Ltd., Edinburgh (GB)

(72) Inventors: John P. Lesso, Edinburgh (GB); Craig A. Anderson, Edinburgh (GB)

(73) Assignee: Cirrus Logic Inc., Austin, TX (US)

( * ) Notice: Subject to any disclaimer, the term of this patent is extended or adjusted under 35 U.S.C. 154(b) by 77 days.

This patent is subject to a terminal disclaimer.

(21) Appl. No.: 18/416,352

(22) Filed: Jan. 18, 2024

(65) Prior Publication Data

US 2024/0204741 A1 Jun. 20, 2024

Related U.S. Application Data

(63) Continuation-in-part of application No. 17/945,517, filed on Sep. 15, 2022, now Pat. No. 11,916,526, which is a continuation of application No. 16/989,114, filed on Aug. 10, 2020, now Pat. No. 11,489,505.

(51) Int. Cl.
*H03G 5/16* (2006.01)
*H04R 3/04* (2006.01)

(52) U.S. Cl.
CPC .............. *H03G 5/165* (2013.01); *H04R 3/04* (2013.01)

(58) Field of Classification Search
CPC . H04R 3/04; G10L 2021/02163; G10L 17/02; G10L 21/0232; G10L 21/0208; H03G 5/025; H03G 5/165; G06F 17/18
USPC ................................. 381/103; 708/323, 445
See application file for complete search history.

(56) References Cited

U.S. PATENT DOCUMENTS

| | | | |
|---|---|---|---|
| 9,420,372 B2 | 8/2016 | Kordon et al. | |
| 10,805,726 B1 | 10/2020 | Ryan et al. | |
| 11,489,505 B2 * | 11/2022 | Lesso | G10L 17/02 |
| 11,916,526 B2 * | 2/2024 | Lesso | G10L 17/02 |
| 2003/0108209 A1 | 6/2003 | McIntosh | |
| 2008/0192956 A1 | 8/2008 | Kazama | |
| 2013/0083939 A1 | 4/2013 | Fellers et al. | |
| 2013/0208917 A1 | 8/2013 | Fielder et al. | |
| 2015/0215700 A1 * | 7/2015 | Sun | H04R 3/002 |
| | | | 381/94.2 |

OTHER PUBLICATIONS

Combined Search and Examination Report under Sections 17 and 18(3), UKIPO, Application No. GB2110767.7, dated Apr. 22, 2022.
Martin, Rainer, Spectral Subtraction Based on Minimum Statistics, Proc. EUSIPCO 94, pp. 1182-1185.

* cited by examiner

*Primary Examiner* — Xu Mei
(74) *Attorney, Agent, or Firm* — Jackson Walker L.L.P.

(57) ABSTRACT

A method of equalising a signal derived from an input device, the method comprising: receiving the signal; applying an order-statistic filter to the signal in the frequency domain to generate a statistically filtered signal; equalising the received signal based on the statistically filtered signal to generate an equalised signal.

22 Claims, 12 Drawing Sheets

METHODS AND SYSTEMS FOR EQUALISATION

The present disclosure is a continuation-in-part of U.S. Non-Provisional patent application Ser. No. 17/945,517, filed Sep. 15, 2022, which is a continuation of U.S. Non-Provisional patent application Ser. No. 16/989,114, filed Aug. 10, 2020, issued as U.S. Pat. No. 11,489,505 on Nov. 1, 2022, each of which is incorporated by reference herein in its entirety.

TECHNICAL FIELD

The present disclosure relates to methods and systems for equalising signals derived from input devices.

BACKGROUND

Voice biometrics systems are becoming widely used. In such a system, a user trains the system by providing samples of their speech during an enrolment phase via a microphone. In subsequent use, the system is able to discriminate between the enrolled user and non-registered speakers. Voice biometrics systems can in principle be used to control access to a wide range of services and systems.

A typical smartphone comprises multiple microphones and any one of such microphones may be used for biometric enrolment, authentication, or both. Acoustic responses of these microphone can vary from microphone to microphone as well as for each microphone over time, due to changes in temperature, acoustic port contamination and general degradation from use. This variation in acoustic response leads to inconsistencies in training data provided for biometric enrolment and authentication systems which in turn decrease the security and robustness of the voice biometric systems using these microphones.

SUMMARY

According to a first aspect of the disclosure, there is provided a method of equalising a signal derived from an input device, the method comprising: receiving the signal; applying an order-statistic filter to the signal in the frequency domain to generate a statistically filtered signal; equalising the received signal based on the statistically filtered signal to generate an equalised signal.

Equalising the signal may comprise setting an equalisation target of an equaliser to an inverse of the statistically filtered signal; and equalising the signal using the equaliser.

The signal may comprise identifying frequency bins of the statistically filtered signal having amplitudes greater than a threshold amplitude; and removing components from frequency bins of the signal corresponding to the identified frequency bins of the statistically filtered signal.

Equalising the signal may comprise setting an equalisation target of an equaliser to a ratio of the statistically filtered signal to the signal; and equalising the signal using the equaliser.

The method may further comprise smoothing the statistically filtered signal to generate a smoothed statistically filtered signal. The equalising may comprise equalising the smoothed statistically filtered signal.

The smoothing may be performed using a moving average filter or a Savitsky-Golay filter.

The method may further comprise applying a threshold to the difference between the statistically filtered signal and the smooth statistically filtered signal to identify frequency bins in the statistically filtered signal having amplitudes exceeding the threshold. The equalising may comprise removing or suppressing components of frequency bins of the signal corresponding to the identified frequency bins in the statistically filtered signal.

The order-statistic filter may comprise one of a median filter, a percentile filter, a minimum filter, a trimmed mean filter, and a trimmed minimum filter. The median filter may be a recursive median filter. The percentile filter may be a recursive percentile filter.

In some embodiments, the portion of the signal comprises the entire signal. In other embodiments, the portion comprises a subset of frequency bins of the signal. A frequency range of the subset of frequency bins may span a frequency of an artefact in the signal.

The method may further comprise determining a discrete Fourier transform of the signal. Applying an order-statistic filter to the signal in the frequency domain may comprise applying the order-statistic filter to the discrete Fourier transform of the signal.

Equalising the received signal may comprise applying weights to frequency bins of the discrete Fourier transform.

According to another aspect of the disclosure, there is provided a method of equalising a signal, comprising: determining a discrete Fourier transform for the signal; determine a median value for each frequency bin of the discrete Fourier transform; smoothing the median values over a frequency range of the discrete Fourier transform; inverting the smoothed median values; and applying a weight to each frequency bin of the discrete Fourier transform based on a corresponding one of the inverted smooth median values.

The method may further comprise using the weighted discrete Fourier transform in a biometric process. The discrete Fourier transform may be a fast Fourier transform (FFT).

The steps of applying the order-statistic filter and/or equalising the received signal may be implemented using a trained neural network.

The input device may comprise a microphone, or a photodetector, or an accelerometer. The signal may comprise an audio signal, or a signal representing light incident a photodetector, or an accelerometer signal.

According to another aspect of the disclosure, there is provided a system for equalising a signal derived from an input device, the system comprising: an input for receiving the signal; one or more processors configured to: apply an order-statistic filter to the signal in the frequency domain to generate a statistically filtered signal; equalise the signal based on the statistically filtered signal to generate an equalised signal.

In some embodiments, equalising the signal may comprise setting an equalisation target of an equaliser to an inverse of the statistically filtered signal; and equalising the signal using the equaliser.

In some embodiments, equalising the signal comprises: identifying frequency bins of the statistically filtered signal having amplitudes greater than a threshold amplitude; and modifying or removing components of frequency bins of the signal corresponding to the identified frequency bins of the statistically filtered signal.

Equalising the signal may comprise setting an equalisation target of an equaliser to a ratio of the statistically filtered signal to the signal; and equalising the signal using the equaliser.

In some embodiments, the steps of applying the order-statistic filter and/or equalising the received signal are implemented using a trained neural network.

The one or more processors may be further configured to smooth the statistically filtered signal to generate a smoothed statistically filtered signal. The equaliser may be tuned using the smoothed statistically filtered signal, wherein the equalising comprises equalising the smoothed statistically filtered signal.

The one or more processors may be further configured to apply a threshold to the difference between the statistically filtered signal and the smooth statistically filtered signal to identify frequency bins in the statistically filtered signal having amplitudes exceeding the threshold. The equalising may then comprise removing or suppressing components of frequency bins of the signal corresponding to the identified frequency bins in the statistically filtered signal.

The order-statistic filter may comprise one of a median filter, a percentile filter, a minimum filter, a trimmed mean filter and a trimmed minimum filter. The median filter may be a recursive median filter. The percentile filter may be a recursive percentile filter.

In some embodiments, the portion of the signal comprises the entire signal. In other embodiments, the portion comprises a subset of frequency bins of the signal. A frequency range of the subset of frequency bins may span a frequency of an artefact in the signal.

According to another aspect of the disclosure, there is provided an electronic device comprising the system described above. The electronic device may comprise one of a smartphone, a tablet, a laptop computer, a games console, a home control system, a home entertainment system, an in-vehicle entertainment system, and a domestic appliance.

According to another aspect of the disclosure, there is provided a non-transitory computer readable storage medium having computer-executable instructions stored thereon that, when executed by one or more processors, cause the one or more processors to perform a method as described above.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

BRIEF DESCRIPTION OF DRAWINGS

Embodiments of the present disclosure will now be described by way of non-limiting examples with reference to the drawings, in which.

DESCRIPTION OF EMBODIMENTS

Embodiments of the present disclosure relate to methods and systems for automatic equalisation of audio signals derived from microphones, and in particular those signals comprising components representing speech. Such equalisation removes noise components which are microphone dependent and/or dependent on external environmental conditions at the microphone, such as temperature, humidity, or degradation of microphones.

Figure 1:
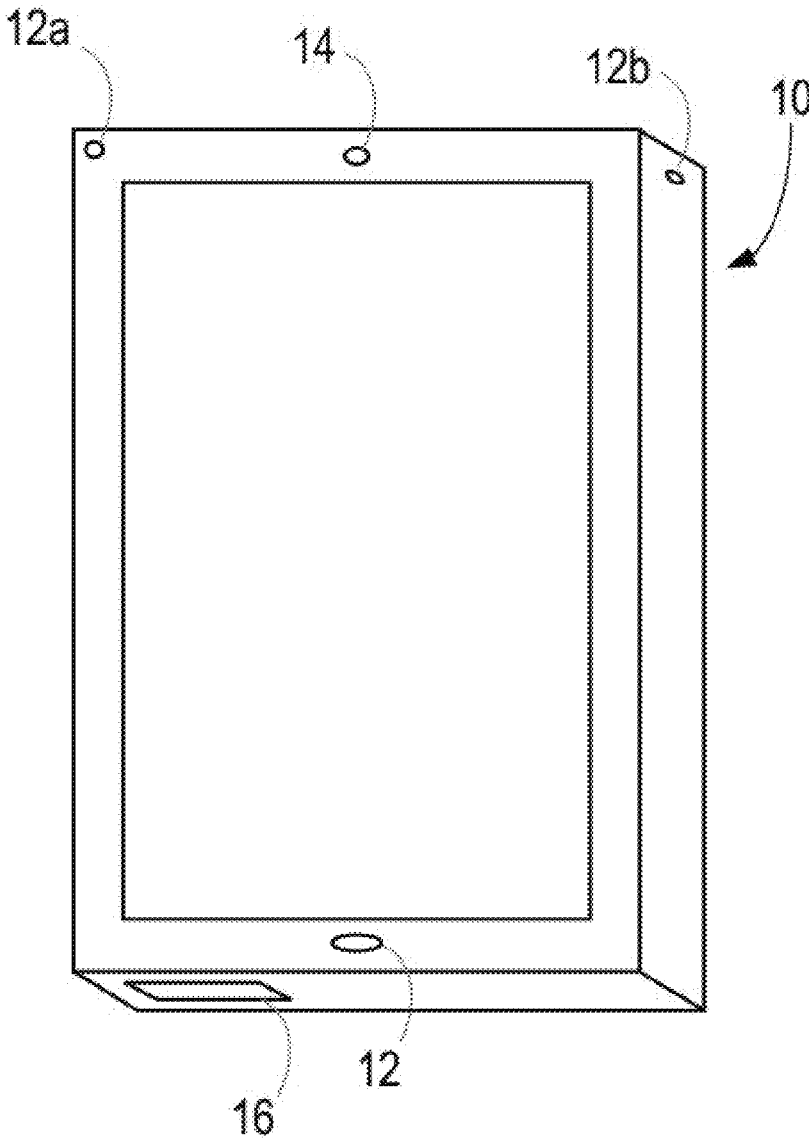
FIG. 1 illustrates a smartphone.

FIG. 1 illustrates a smartphone 10, having a microphone 12 for detecting ambient sounds. In normal use, the microphone 12 is of course used for detecting the speech of a user who is holding the smartphone 10.

The smartphone 10 also has two loudspeakers 14, 16. The first loudspeaker 14 is located at the top of the smartphone 10, when it is held in its normal operating position for making a voice call, and is used for playing the sounds that are received from the remote party to the call.

The second loudspeaker 16 is located at the bottom of the smartphone 10 and is used for playing back media content from local or remote sources. Thus, the second loudspeaker 16 is used for playing back music that is stored on the smartphone 10 or sounds associated with videos that are being accessed over the internet.

The illustrated smartphone 10 also has two additional microphones 12a, 12b. The additional microphones, if present in the device, may be provided at any suitable location. In this illustrated device, one microphone 12a is located at the top end of the front of the device, while another microphone 12b is located at the top end of the side of the device.

Figure 2:
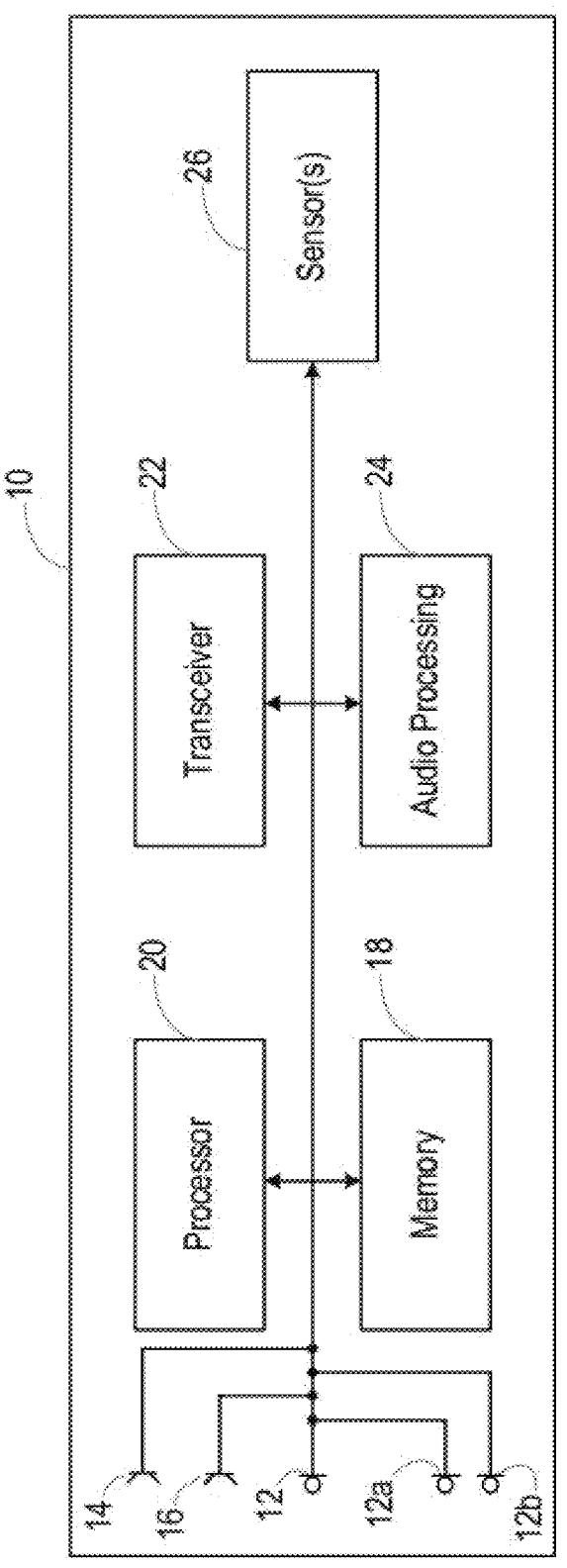
FIG. 2 is a schematic diagram, illustrating the form of the smartphone.

FIG. 2 is a schematic diagram, illustrating the form of the smartphone 10.

Specifically, FIG. 2 shows various interconnected components of the smartphone 10. It will be appreciated that the smartphone 10 will in practice contain many other components, but the following description is sufficient for an understanding of the present invention.

In certain embodiments, the smartphone 10 is provided with multiple microphones 12, 12a, 12b, etc.

FIG. 2 also shows a memory 14, which may in practice be provided as a single component or as multiple components. The memory 14 is provided for storing data and program instructions.

FIG. 2 also shows a processor 16, which again may in practice be provided as a single component or as multiple components. For example, one component of the processor 16 may be an applications processor of the smartphone 10.

FIG. 2 also shows a transceiver 18, which is provided for allowing the smartphone 10 to communicate with external networks. For example, the transceiver 18 may include circuitry for establishing an internet connection either over a Wi-Fi local area network or over a cellular network.

FIG. 2 also shows audio processing circuitry 20, for performing operations on the audio signals detected by the microphone 12 as required. For example, the audio processing circuitry 20 may filter the audio signals or perform other signal processing operations. As will be described in more detail below, the audio processing circuitry 20 may comprise circuitry for determining certain characteristics of one or more of the microphones 12, 12a, 12b, and for equalising signals received at the one or more of the microphones 12, 12a, 12b.

The smartphone 10 may also comprise one or more sensors 26. In certain embodiments, the sensor(s) may include any combination of the following: gyroscopes, accelerometers, proximity sensors, light level sensors, touch sensors, cameras and magnetic field sensors.

In some embodiments, the smartphone 10 is provided with voice biometric functionality, and with control functionality. Thus, the smartphone 10 is able to perform various functions in response to spoken commands from an enrolled user. The biometric functionality is able to distinguish between spoken commands from the enrolled user, and the same commands when spoken by a different person. Thus, certain embodiments relate to improving the operation of a smartphone or another portable electronic device with some sort of voice operability, for example a tablet or laptop computer, a games console, a home control system, a home entertainment system, an in-vehicle entertainment system, a domestic appliance, or the like, in which the voice biometric functionality is performed in the device that is intended to carry out the spoken command. Certain other embodiments relate to systems in which the voice biometric functionality is performed on a smartphone or other device, which then transmits the commands to a separate device if the voice biometric functionality is able to confirm that the speaker was the enrolled user.

In some embodiments, while voice biometric functionality is performed on the smartphone 10 or other device that is located close to the user, the spoken commands are transmitted using the transceiver 18 to a remote speech recognition system, which determines the meaning of the spoken commands. For example, the speech recognition system may be located on one or more remote server in a cloud computing environment. Signals based on the meaning of the spoken commands are then returned to the smartphone 10 or another local device.

To perform voice biometric functionality, the smartphone 10 may implement biometric enrolment and biometric authentication. Enrolment comprises the acquisition and storage of biometric data which is characteristic of an individual. For voice biometrics, the biometric data is characteristic of a user's voice as received at one or more of the microphones 12, 12a, 12b of the smartphone 10. Authentication (alternatively referred to as verification or identification) comprises the acquisition of biometric data from an individual, again as received at one or more of the microphones 12, 12a, 12b, and the comparison of that data to stored biometric data for the individual. In some instances, a neural network is trained using biometric data collected during enrolment (and optionally re-enrolment of the user over time) and authentication involves inputting speech data derived from one or more of the microphones 12, 12a, 12b into the trained neural network.

As noted above, the smartphone 10 may comprise multiple microphones 12, 12a, 12b. The acoustic response of each of these microphones 12, 12a, 12b is dependent on a number of factors not limited to manufacturing variations, temperature, and orientation, shape and contamination of ports associated with each of the microphones 12, 12a, 12b. As such, the acoustic response of each microphone 12, 12a, 12b will vary over time, which leads to inconsistencies in the biometric data being provided for biometric enrolment and authentication. Additionally, if a different microphone is used for each of enrolment and authentication, this may lead to poor performance of authentication if the acoustic response of each microphone at the time of respective enrolment and authentication is sufficiently different.

Embodiments of the present disclosure aim to address or at least ameliorate some of these issues by using an estimate of noise floor associated with one or more of the microphone(s) 12, 12a, 12b to equalise or normalise an audio signal derived therefrom.

Figure 3:
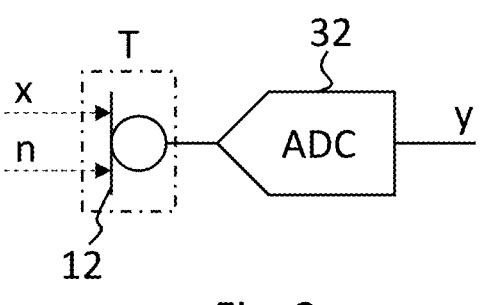
FIG. 3 is a block diagram of a microphone of the smartphone.

FIG. 3 shows the microphone 12 of the smartphone 10 having an output provided to an analogue-to-digital converter (ADC) 32 forming part of the audio processing circuitry 24 of the smartphone 10. The microphone 12 receives an input signal x comprising speech from a user in addition to ambient noise n. The input signal and noise experience some transfer function T associated with the microphone such that the signal y derived from the microphone may be defined as:

$$y = T(n + x)$$

As discussed above, the transfer function T of the microphone 12 is dependent on several factors which vary from microphone to microphone and also over time due to fluctuations in temperature and deterioration of port quality.

As such, in the above equation, whilst y is measurable, the input signal x, ambient noise n and transfer function T are variable and unknown. However, the properties of the speech signal x are different to those of ambient noise n and noise introduced by the transfer function T of the microphone. Specifically, since the amplitude of speech components of the frequency domain series of y tend to be outliers respective to the remainder of components of the signal y, the noise n and transfer function T can be estimated and subsequently removed from the signal y.

Hence, by applying an order-statistic filter, $\theta$, to y, an estimate of the noise floor can be determined such that:

$$\theta(y) \approx nT$$

This approximation of nT can then be used to design an equaliser to remove both ambient noise n and the microphone transfer function T from the signal y, leaving substantially the signal x for voice biometrics.

Figure 4:
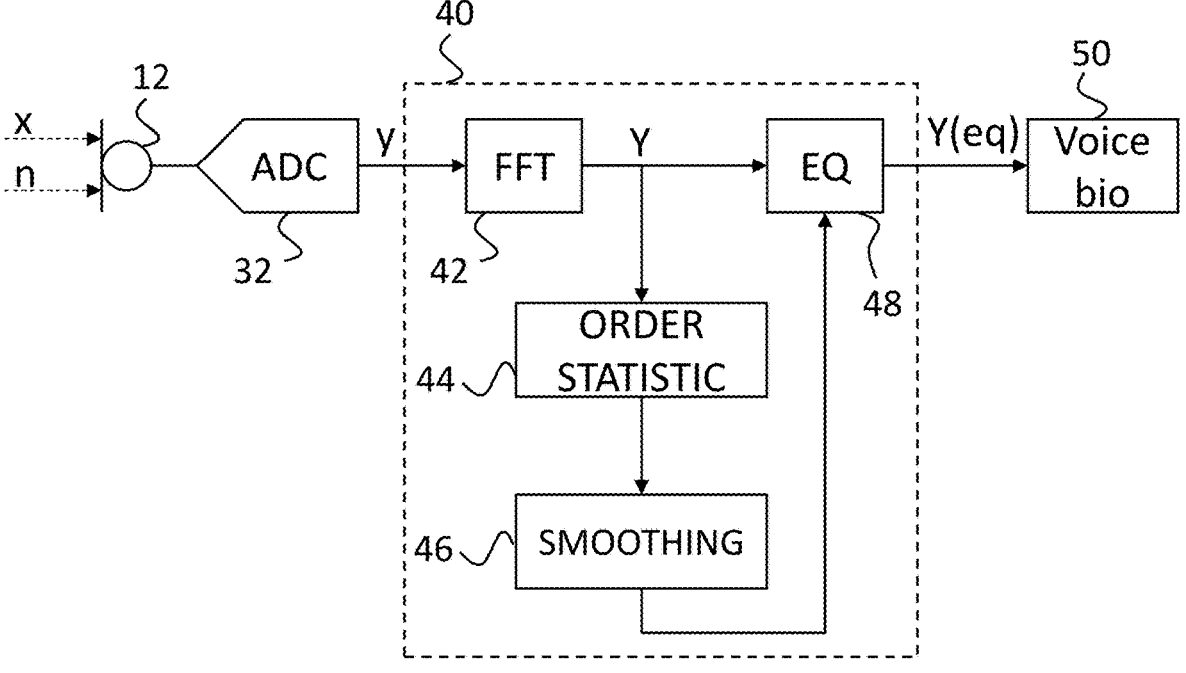
FIG. 4 is a block diagram of an audio processing module for implementing equalisation of a signal derived from the microphone.

FIG. 4 is a block diagram of an audio processing module 40 which may be implemented using the audio processing circuitry 20 of the smartphone 10. The module 40 is configured to receive a digital input signal y, for example from the ADC 32, and output an equalised audio signal y(eq), for example to a voice biometric module 50 implemented by the smartphone 10.

The audio processing module 40 comprises a Fourier transform module 42 which converts the received audio signal y into a frequency domain representation Y. For example, the Fourier transform module 42 may implement a fast Fourier transform (FFT). In some embodiments, the audio signal y may be provided to the audio processing module 40 in the frequency domain, in which case the Fourier transform module 42 may be omitted.

The audio processing module 40 further comprises an order-statistic filter module 44 configured to filter the frequency domain representation Y of the audio signal y to generate an approximation of the combination of noise associated with ambient noise at the microphone 12 and noise associated with the microphone 12 itself as expressed by the transfer function T.

Optionally, the order statistic filter module 44 may be configured to filter the frequency domain representation Y of the audio signal y using a trained neural network. For example, the neural network may be trained with data related to the noise associated with ambient noise at the microphone 12 as well as noise associated with the micro-phone itself.

Optionally, the audio processing module 40 comprises a smoothing module 46 configured to smooth the filtered power spectrum θ(Y). The smoothing module 46 may implement a moving average filter or a Savitsky-Golay filter, or a Kalman filter to name a few examples.

The audio processing module 40 further comprises an equalisation module 48 configured to apply equalisation (EQ) to the frequency domain representation Y of the audio signal y. The statistically filtered power spectrum θ(Y), smoothed or otherwise, is also provided as an input to the equalisation module 48. The equalisation module 48 may be configured to tune a series of equalisation parameters based on the received statistically filtered power spectrum θ(Y). The equalisation module 48 may therefore be configured to apply weights to respective frequency bins of the audio signal y. In some embodiments, the equalisation parameters are trained using machine learning. For example, a neural network may be trained based on the statistically filtered power spectrum θ(Y).

The order-statistic filter module 44 may implement any known order-statistic filter to provide an estimate of the noise floor nT. In preferred embodiments, the order-statistic filter comprises a median filter.

Further examples of order-statistic filters which may be implemented by the order-statistic filter module 44 include a percentile filter, a minimum filter, a trimmed mean filter (configure to remove M highest and lowest elements and average the remaining elements), or a trimmed minimum (configured to remove all but the lowest M elements and average the remaining M elements).

While they provide an accurate estimate of the noise floor, the skilled person will recognise that standard median and percentile filters require data to be sorted in order of mag-nitude and hence are computationally rigorous and require memory. Accordingly, instead of using standard median or percentile filters, recursive approximations of these filters can be implemented, which require less memory and com-putation to implement.

The median γ for a data set x can be approximated using the following equation.

$$\gamma_{n+1}^* = \gamma_n^* + \lambda \, \mathrm{sgn}\{x_n - \gamma_n^*\}$$

To reduce the time taken for the median filter to converge, λ is preferably varied during a calibration period. In some instances, this adjustment of λ can substantially reduce the time taken for the recursive median filter to achieve a robust estimate of the noise floor when compared to implementing the filter with a static value for λ.

The percentile q for a data set x can be approximated using the following equation.

$$q_{n+1}^* = q_n^* + \lambda(\mathrm{sgn}\{x_n - q_n^*\} - 2p + 1)$$

Where λ is small and p is a percentile between 0 and 1. In the case of p=0.5, the above approximates to the median.

As with the recursive median filter described above, variation of A during a calibration or start up period reduces the time taken for the percentile filter to achieve a robust estimate of the median.

The inventors have found that the percentile filter pro-vides an accurate estimate of the median in the presence of noise only (without speech). However, in the presence of speech, the estimate of median tends to be positively biased. Accordingly, where the recursive percentile filter is used as the order-statistic filter, a derived gain term may be applied to the output of the percentile filter for frames of the received audio signal comprising speech so as to reduce or substan-tially remove the inherent bias. In contrast to the percentile filter, the output from the recursive median filter does not suffer from such biasing; the estimates of median are sub-stantially the same in the presence and absence of speech.

In some embodiments, the equalisation module 48 may update the EQ to be applied over time based on the output from the order-statistic module 44. The equalisation module 48 may update the EQ periodically, for example every second. Alternatively, the equalisation module 48 may update only when speech is not present in the received audio signal. In other words, the equalisation module 48 may continue to apply the same EQ as was applied to the signal before speech was present, only updating to a new RQ when it is determined that speech is no longer present in the received audio signal.

In some embodiments, when transitioning from an old EQ to a new EQ may comprise a step change in EQ. In some embodiments, transition between the current and updated EQ may be smoothed. For example, during a transition period, a transitional EQ may be applied. The transitional EQ may be a weighted average of the old and new EQs, such that:

$$EQ_{transitional} = \alpha EQ_{old} + (1 - \alpha)EQ_{new}$$

Where α is a tuning factor between 0 and 1 which may be varied over time to mix over from the old EQ to the new EQ.

In the above examples, EQ is applied to the received audio signal Y in real time. In other embodiments, equali-sation could be applied to buffered data. For example, the received audio signal could be buffered until a trigger event (such as the receipt of a keyword or the like). The order statistic module 44 may then apply the order-statistic filter to the buffered data which could then be equalised and handed downstream from the buffer. This may be particularly useful for embodiments where the equalised audio signal is provided to the voice biometric module 50 for biometric processing. A speech recognition module (not shown) may monitor the received audio signal for speech comprising a trigger command to then implement equalisation on buffered audio including the speech comprising the trigger command.

Figure 5:
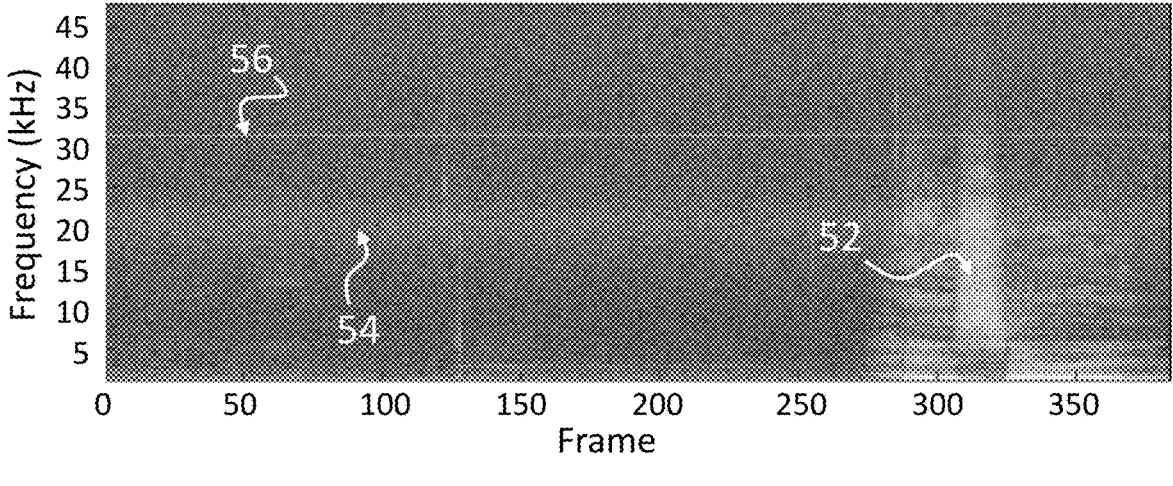
FIG. 5 is a frequency spectrogram for a signal derived from the microphone.
Figure 6:
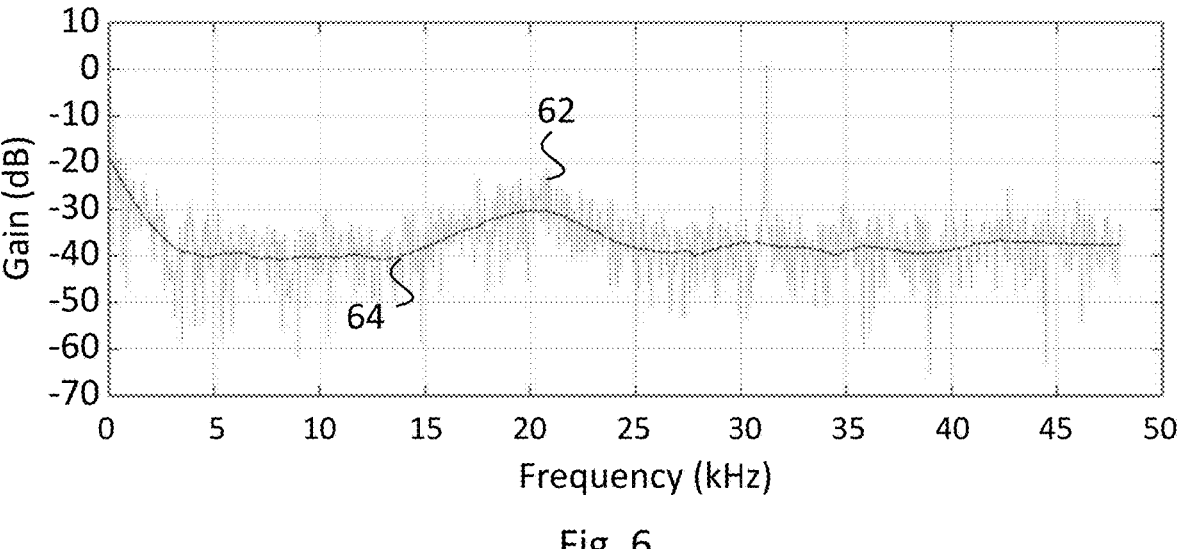
FIG. 6 is a power spectrum plot of the signal shown in FIG. 5.

FIGS. 5 and 6 show the effect of the order statistic module 44 and the smoothing filter 46.

FIG. 5 is a frequency spectrogram for a typical audio signal derived from the microphone 12. The plot depicts speech 52 from a user in addition to an acoustic (Helmholtz) resonance 54 produced by the microphone 12 at around 21 kHz. An additional tone 56 is also present in the received audio signal at approximately 32 kHz, which is an artefact from a regulator in the smartphone 10.

FIG. 6 is a frequency vs gain (power spectrum) plot of the filtered audio signal 62 being a filtered version of the signal shown in FIG. 5 having been filtered by the order-statistic filter module 44 using a recursive median filter. A smoothed filtered audio signal 64 is also depicted, this being the output from the smoothing module 46, if implemented.

Figure 7:
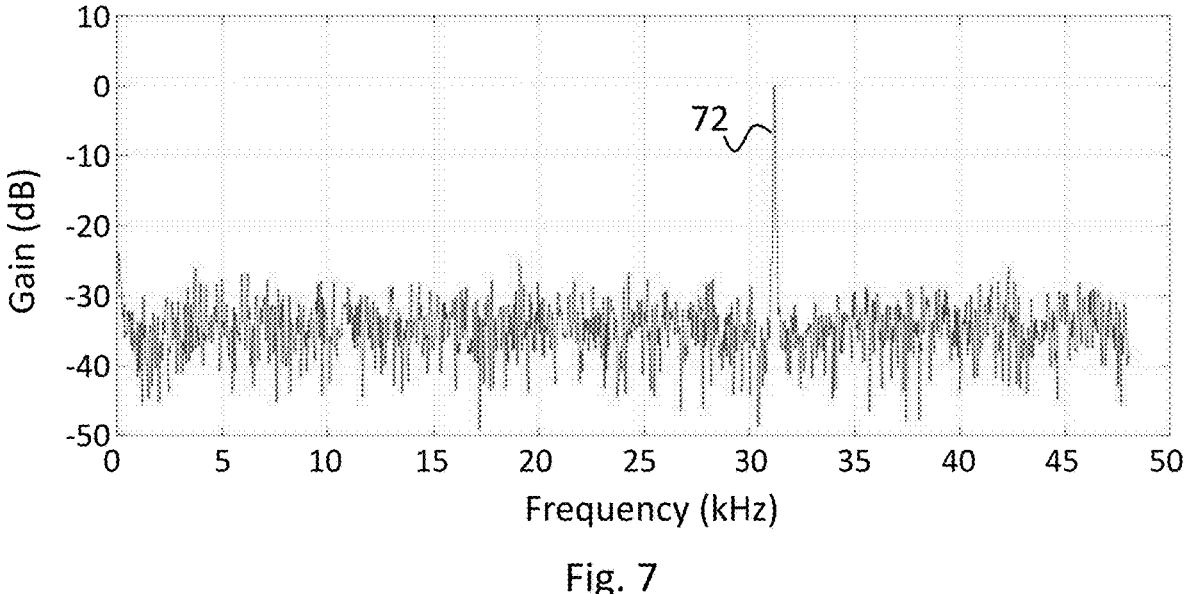
FIG. 7 is a power spectrum plot of the signal shown in FIG. 5 after output from the audio processing module of FIG. 4.

FIG. 7 depicts the output audio signal for the equalisation module 48 having been tuned using the smooth filtered power spectrum 64. In this example, the smoothed filtered power spectrum 64 is used as an equalisation target for the equalisation module 48. It can be seen from this plot that low frequency noise and acoustic resonance from the microphone 12 have both been removed by equalisation. It can also be seen that the tone 56 is still present in the signal output from the equalisation module 48.

Figure 8:
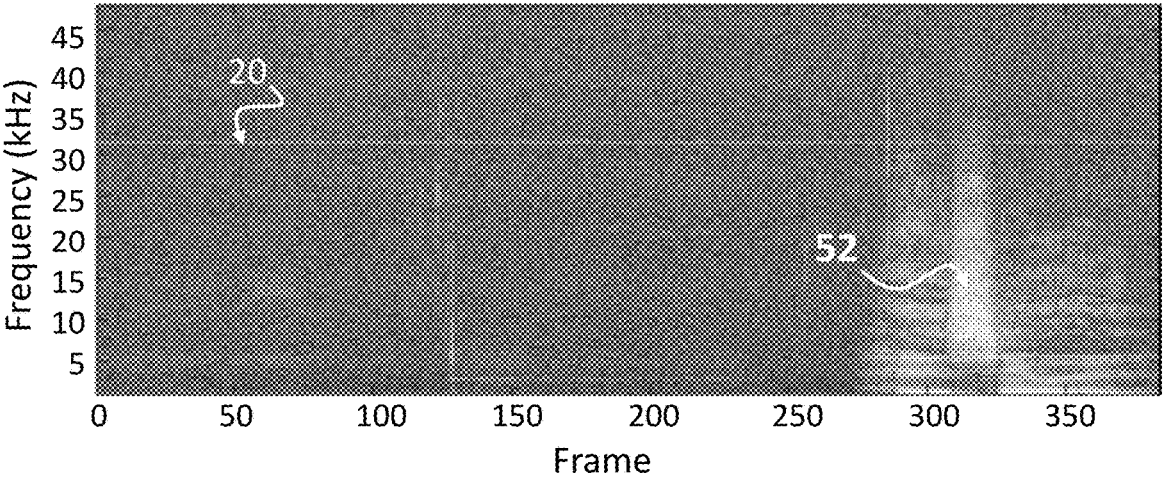
FIG. 8 is a frequency spectrogram of the signal shown in FIG. 5 after output from the audio processing module of FIG. 4.

FIG. 8 is an amplitude plot of frame vs frequency for the smooth filtered signal output from the equalisation module 48. It can be seen from this plot that the speech 52 from the user is still present, but the acoustic (Helmholtz) resonance 54 produced by the microphone 12 at around 21 kHz has been removed. Again, as mentioned above with reference to FIG. 7, the tone 56 is still present in the received audio signal at approximately 32 KHz.

The statistical analysis of the audio signal y can also be used to remove tones and similar signal artefacts present in the audio signal y. It can be seen, for example, from FIG. 6 that the tone 56 is an amplitude outlier in the measured noise floor 62 at 32 kHz. However, if the tone 56 is not present in the smoothed filtered power spectrum 64. By applying a threshold to the difference between the filtered power spectrum 62 and the smoothed filtered power spectrum 64, it is possible to identify the tone 56 and generate a new noise floor estimate.

Figure 9:
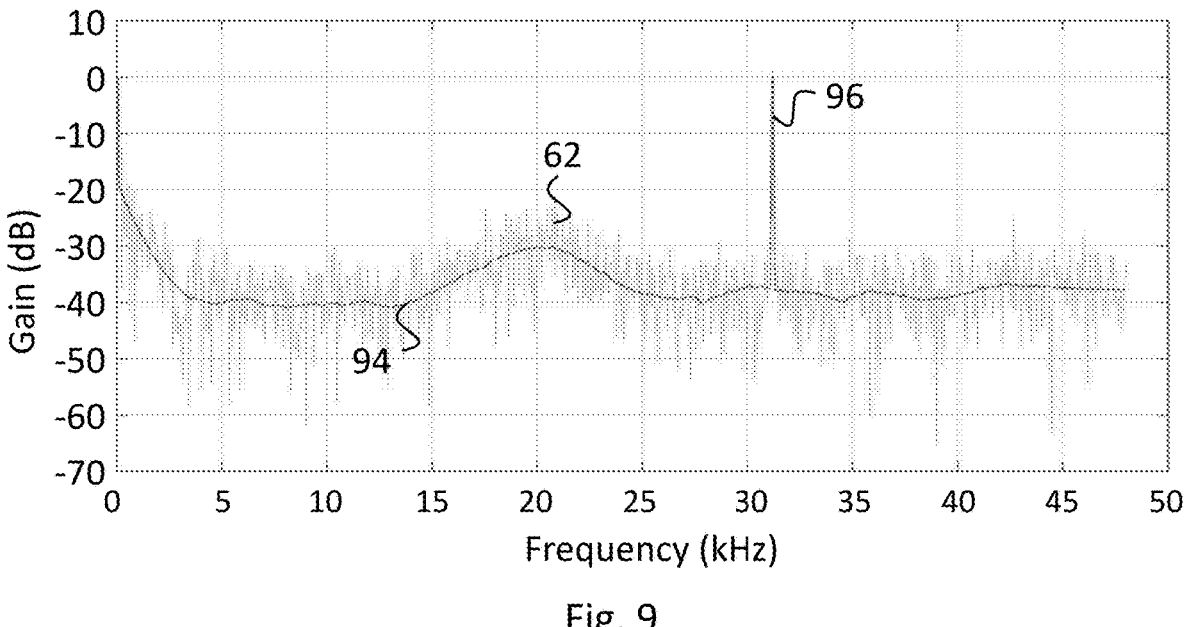
FIG. 9 is a power spectrum plot of the signal shown in FIG. 5.

FIG. 9 is a frequency vs gain (power spectrum) plot showing the filtered power spectrum 62 together with the new smoothed filtered power spectrum 94 which includes the tone outlier 96. This adjusted power spectrum 94 can then be provided to the equalisation module 48. The equalisation module 48 may then be configured to tune a series of equalisation parameters based on the received statistically filtered power spectrum θ(Y).

Figure 10:
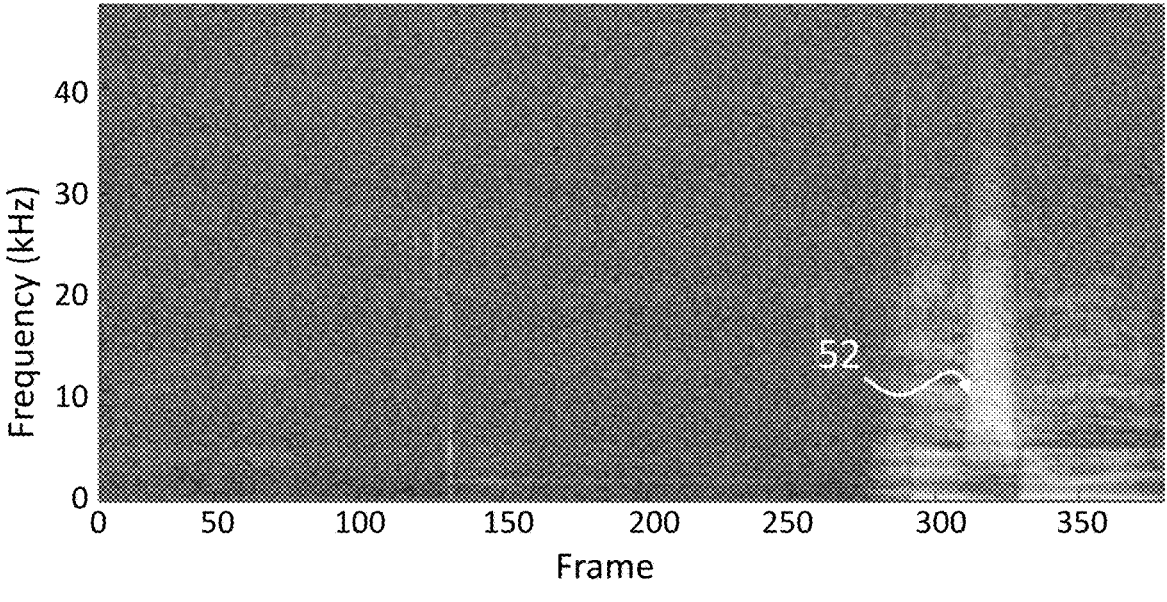
FIG. 10 is a frequency spectrogram of the signal shown in FIG. 5 after output from the audio processing module of FIG. 4.

FIG. 10 shows the effect of equalising the audio spectrum Y using the new smoothed filtered power spectrum 94. It can be seen that both the noise 54 and the tone 56 have been removed, leaving only the speech signal 52.

In the embodiments shown above, the equalisation module 48 is configured to apply equalisation to all frequencies of the frequency domain representation Y of the audio signal y. However, it may be desirable in some instances to apply equalisation to a subset of frequencies. In some embodiments, for example, equalisation may be applied over frequencies at which noise from the microphone(s) 12, 12a, 12b or other components of the smartphone 10 is present in the signal y. For example, equalisation may be applied across a frequency range associated with a Helmholtz frequency of one or more of the microphone(s) 12, 12a, 12b, taking into account conceivable operating temperature range of the smartphone.

In some embodiments, noise introduced by components of the smartphone 10 other than the microphone(s) 12, 12a, 12b may drown out noise associated with the microphone(s) 12, 12a, 12b at certain frequencies. In which case, the equalisation module 48 may apply equalisation only at frequencies at which noise T from the microphone and ambient noise n contributes significantly to the overall noise in the audio signal y.

Figure 11:
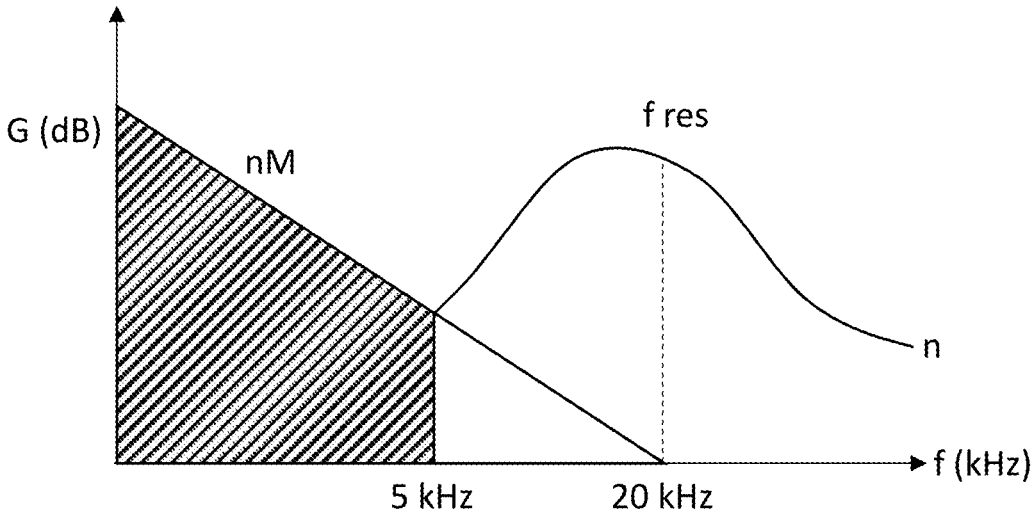
FIG. 11 is a plot of frequency vs gain for a signal derived from the microphone comprising flicker noise from an analogue-to-digital converter.

FIG. 11 illustrates an example scenario in which the ADC 32 generates large amounts of flicker noise nm. In this case, the audio signal y derived from the microphone may be defined as:

$$y = T(n + x) + n_M$$

At frequencies below 5 kHz the flicker noise nm dominates the power spectrum. As such, in this example, the equalisation module 48 may apply equalisation at frequencies above 5 kHz.

Figure 12:
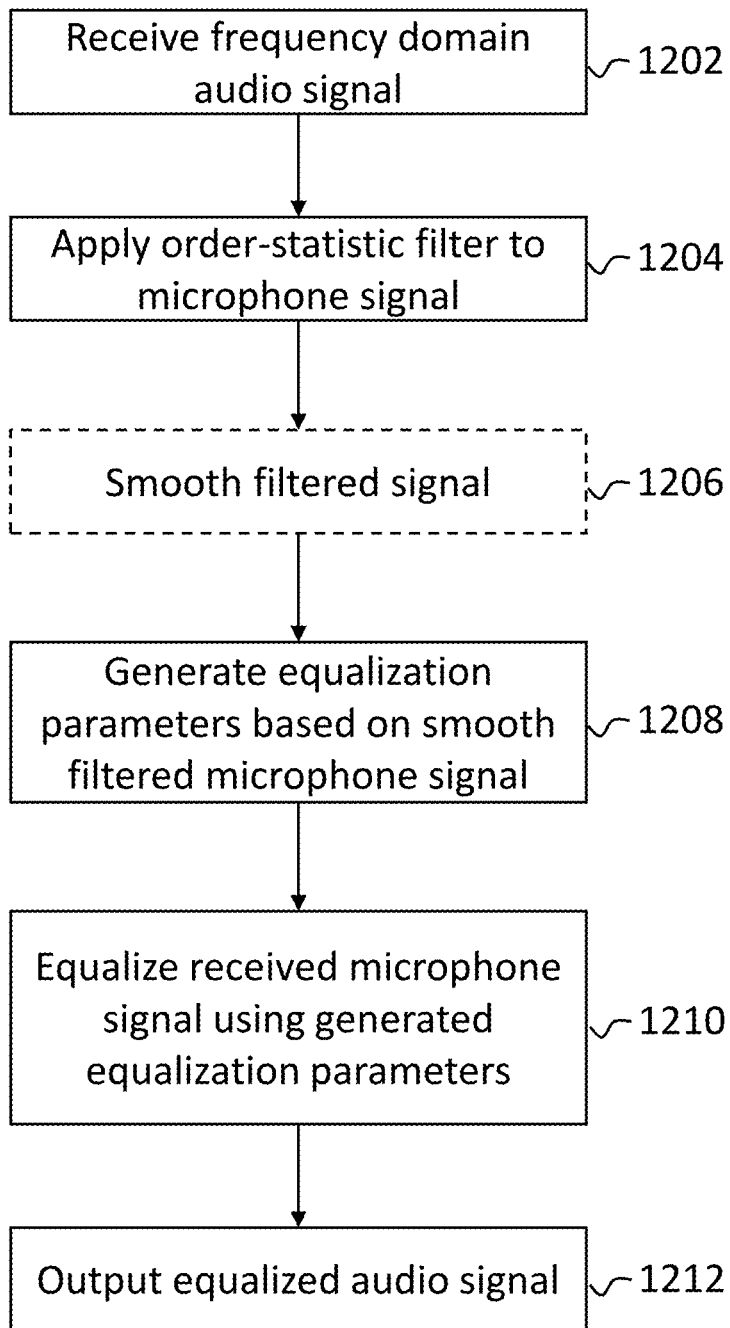
FIG. 12 is a flow chart illustrating a method in accordance with the disclosure.

FIG. 12 is a flow chart illustrating a method of equalising an audio signal derived from the microphone 12 implemented by the audio processing module 40.

Referring also to FIG. 4, at step 1202, a frequency domain representation Y of the audio signal derived from the microphone 12 is received. If the signal is received in the time domain, then the signal may optionally be converted by the Fourier transform module 42 to the frequency domain.

At step 1204 an order-statistic filter is applied to the frequency domain representation by the order-statistic filter module 44 to generate a statistically filtered power spectrum.

At optional step 1206, the statistically filtered audio signal may be smoothed by the smoothing module 46 to generate a smoothed statistically filtered audio signal.

At step 1208, either the statistically filtered audio signal output from the order-statistic filter module 44 or the smoothed statistically filtered audio signal output from the smoothing module 46 or both signals, are provided to the equalisation module 48 which subsequently generates equalisation parameters based on one or both signals (depending on which signal(s) are received). The equalisation parameters may be generated as described in any of the examples above, for example, to remove the transfer function T, the noise n at the microphone, or any tones associated with regulators and other components present in the received audio signal y. The generated equalisation parameters are then used to tune an equaliser implemented by the equalisation module 48.

At step 1210, the frequency domain representation of the audio signal Y is provided to the equalisation module 48 which equalises the signal Y using the generated equalisation parameters. In other embodiments, the equalisation module 48 may equalise a time domain representation of the signal Y. For example, the frequency domain representation of the audio signal Y may be provided to an inverse Fourier transform module (not shown) which may perform an inverse Fast Fourier transform (IFFT) to convert the frequency domain representation into the time domain. That time domain representation may then be provided to the equalisation module 48.

At step 1212, the equalised signal is output from the equalisation module 48, and optionally provided to the voice biometric module 50.

Figure 13:
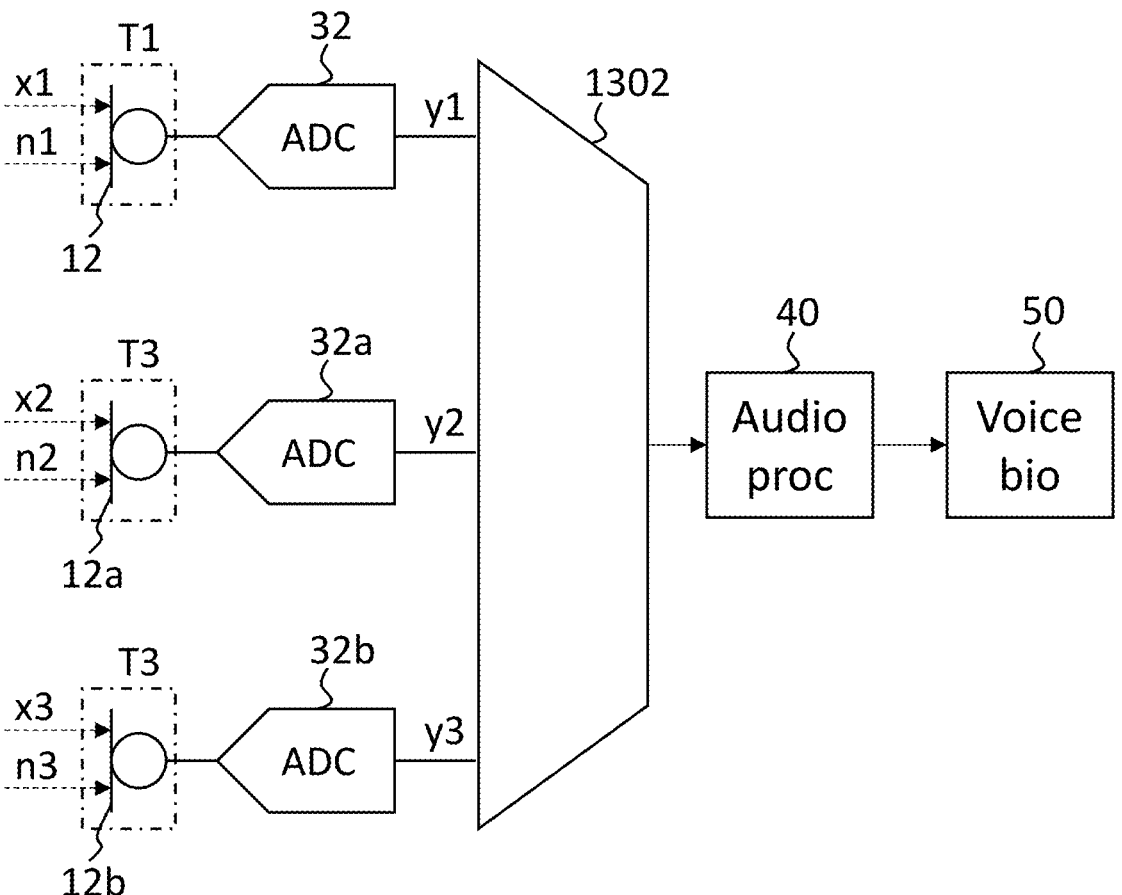
FIG. 13 is a block diagram of a system comprising the audio processing module.
Figure 14:
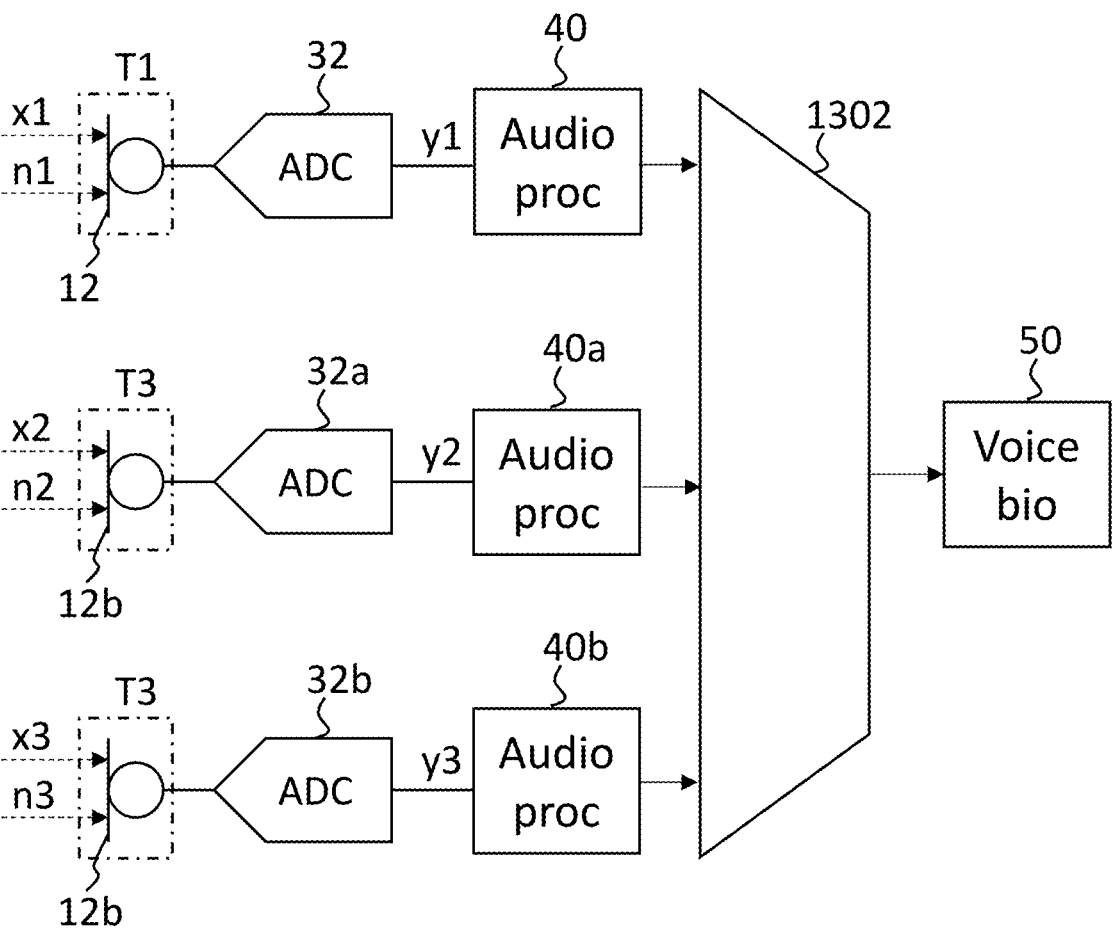
FIG. 14 is a block diagram of a system comprising the audio processing module.

In embodiments described above, the audio processing module 40 is configured to receive a digital input signal y, for example from the ADC 32, and output an equalised power spectrum y(eq), for example to a voice biometric module 50 implemented by the smartphone 10. In some embodiments, however, audio signals derived from multiple microphones 12, 12a, 12b of the smartphone 10 may be used by the audio processing module 40 to generate the equalised power spectrum y(eq). It will be appreciated that the transfer function of each of these microphones 12, 12a, 12b may be different. Accordingly, equalisation parameters for removing noise associated with their respective transfer functions will be different. FIGS. 13 and 14 show exemplary architectures for substantially normalising the effect of variations in microphone transfer function.

FIG. 13 is a block diagram showing an example architecture. A plurality of microphones 12, 12a, 12b of the smartphone 10 are each coupled to a respective ADC 32, 32a, 32b whose digital outputs y1, y2, y2 are provided to a multiplexer 1302. The multiplexer 1202 is configured to select one of the three signals y1, y2, y3, derived from the three microphones 12, 12a, 12b, for use in voice biometrics. The selected one of the three signals y1, y2, y3 is then provided to the audio processing module 40 for equalisation in the manner described above with reference to FIG. 4.

Selection of one of the signal y1, y2, y3 by the multiplexer 1303 may be based on a determination of the best microphone to be used for a voice biometric process. In the case of the smartphone 10, for example, this may be the microphone closest to the user's mouth. In some embodiments, it may be determined that one or more of the microphones 12, 12a, 12b is occluded or blocked. In which case, another one of the microphones 12, 12a, 12b may be chosen for the voice biometric process. In some embodiments, the microphone(s) 12, 12a, 12b may be tuned to have different performance characteristics. For example, one of the microphones 12, 12a, 12b may be tuned to perform best at a given overload point of signal to noise ratio (SNR). For example, one of the microphones 12, 12a, 12b may be implemented as an always-on microphone for detecting voice commands and another of the microphones 12, 12a, 12b may be used for recording voice calls or video. In which case, the always-on microphone may be set up to have a low resolution and thus lower power usage. Methods of choosing the best microphone for such operations are well known in the art and so will not be described in detail here. The multiplexer 1302 may be configured switch between the signals y1, y2, y3 input to the multiplexer 1302 over time on determination that one or other of the signals y1, y2, y3 is the optimum signal for use in voice biometrics.

FIG. 14 shows another example architecture. Instead of providing a single audio processing module 40 at the output of the multiplexer 1302 as shown in FIG. 12, multiple audio processing modules 40, 40a, 40b are provided, each receiving a respective signal y1, y2, y3 from one of the microphones 12, 12a, 12b. In this embodiment, the multiplexer 1302 is provided with three equalised audio signals Y1 (eq), Y2 (eq), Y3 (eq) from the three audio processing modules 40, 40a, 40b. The multiplexer 1302 is then configured to select and provide one of these signals Y1(eq), Y2 (eq), Y3 (eq) to the voice biometric system 50.

In a variation of the architecture shown in FIG. 14, the multiple audio processing modules 40, 40a, 40b may be implemented as a single module configured to receive multiple inputs derived from each of the microphones 12, 12a, 12b.

In the embodiments shown in FIGS. 13 and 14, three microphones 32, 32a, 32b are shown. It will be appreciated that in other embodiments any number of microphone signals may be provided to the multiplexer 1202 for processing by the audio processing module 40.

In embodiments described above, an order-statistic filter, θ, is applied to a signal y derived from a microphone 12. The signal y derived from the microphone 12 is made up of two components, namely an input signal x and noise n which experience some transfer function T associated with the microphone 12. It will be appreciated, however, that embodiments of the present disclosure are not limited to audio applications. Embodiments may be applied equally to the processing of signals other than audio signals. In the case of processing of audio signal comprising speech, the use of the order statistic filter, θ, relies on the fact that the amplitude of speech components of the frequency domain series of y tend to be statistical outliers respective to the remainder of components of the signal y. Thus, the same signal processing techniques as those described above can be used to extract any component of a signal which is statistically different respective to the remainder of components of that signal y.

Figure 15:
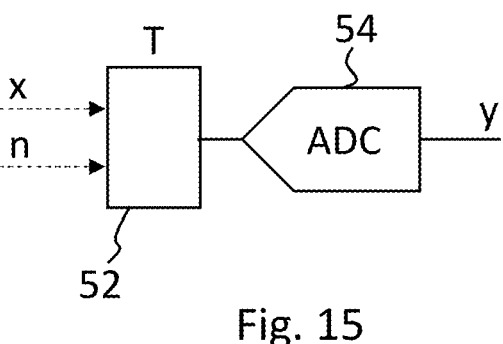
FIG. 15 is a block diagram of an input device.

FIG. 15 shows an input device 52 having an output provided to an analogue-to-digital converter (ADC) 54 which may form part of larger signal processing circuitry (not shown). The input device 52 may comprise any device configured to generate an output signal based on a received input signal and which may be susceptible to noise. Non-limiting examples of such input device 52 include movement sensors (accelerometers, magnetometers etc.), and health sensors (analyte, oxygen saturation, heart rate, pulse wave velocity, temperature, respiration rate, blood pressure, electrocardiogram (ECG), photoplethysmography (PPG) etc.).

The input device 52 receives an input signal x which may be a signal of interest. In addition to the input signal x, the input device 52 may also receive noise n. The input signal x and noise n experience some transfer function T associated with the input device 52 such that the signal y derived from the input device 52 may be defined as:

$$y = T(n + x)$$

As discussed above, the transfer function T of the input device 52 may be dependent on several factors which vary depending on the type of input device 52, as well as variations in characteristics between examples of the same type of input device 52.

As such, in the above equation, whilst y is measurable, the input signal x, ambient noise n and transfer function T are variable and unknown. However, if the properties of one of the input signal x, ambient noise n, and transfer function T are statistically different (i.e. a statistical outlier) to the remaining components of the signal y, an order statistic filter, θ, can be applied to that statistical outlier to estimate the remaining components of the signal y.

It will be appreciated that in some applications, the noise n received at the input device 52 may be a statistical outlier relative to the input signal x and the transfer function T of the input device 52. For example, where the input device 52 is a PPG sensor and the input signal x comprises light, the input signal x may be modulated by movement of the input device 52 (PPG sensor) relative to the skin of a subject. This movement of the input device 52 will lead to noise n which will statistically differ from the AC waveform which is being captured by the input signal x. In another example, the input device 52 may comprise a photodetector forming part of an oxygen saturation (SpO2) sensor. Again, in this example, movement of the input device 52 relative to the skin of a subject will cause the input device 52 to receive noise n which is statistically different to the input signal x (i.e. the signal of interest which corresponds to blood oxygen concentration). In another example, the input device 52 may comprise an accelerometer which may be used to aid the accuracy of a global positioning system (GPS), for example to track a person's movement. In this case, the input signal x may comprise the long-term movement information obtained by the accelerometer, whereas short term acceleration caused by that person's gate may represent noise n. In which case, the noise n is a statistical outlier. In a further example, which represents the example described above with reference to FIGS. 3 to 14, the input signal x comprises speech. Due to the nature of speech, it is the speech itself that renders the input signal x a statistical outlier relative to noise n.

Suppose then that the noise n is a statistical outlier relative to the input signal y, as is the case in the PPG sensor, photodetector, and accelerometer examples above. By applying an order-statistic filter, e, to n, an estimate of the input signal x can be determined such that:

$$\theta(y) \approx xT$$

This approximation of xT can then be used to design an equaliser to normalise signal to noise ratio (SNR) such that each frequency bin has the same information pertaining to the input signal x.

Thus, a variation of the audio processing module 40 described above may be implemented to remove any component of a received signal y which is a statistical outlier (e.g. impulsive) relative to other components of the signal y, whether that statistical outlier is noise, a signal of interest, or some other signal component.

Figure 16:
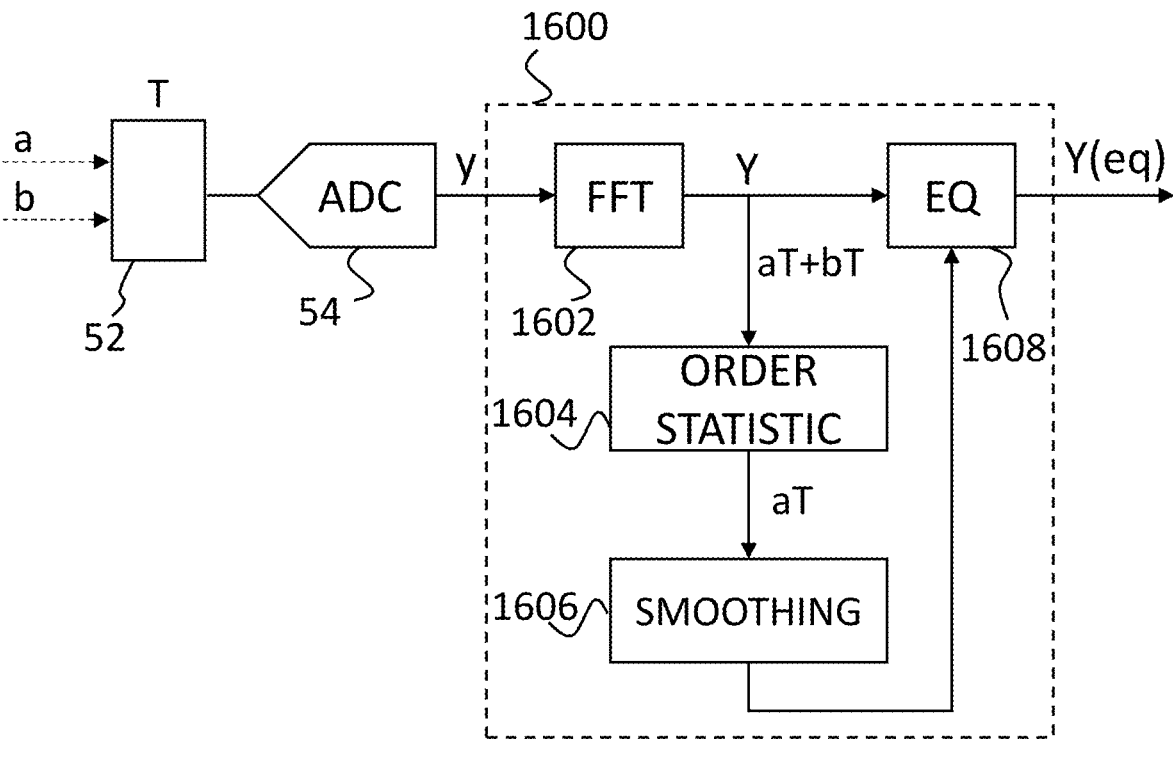
FIG. 16 is a block diagram of a signal processing module for implementing equalisation of a signal derived from the input device.

FIG. 16 is a block diagram of a signal processing module 1600 which differs from the audio signal processing module 40 of FIG. 4 in that the signal processing module 1600 may be configured to process an input signal y other than an audio signal comprising some component which statistically differs from the remainder of the input signal y. The signal processing module 1600 is configured to receive a digital input signal y, for example from the ADC 54, and output an equalised audio signal y(eq). In this example, the input signal y comprises two components, a first component a and a second component b. The first component a is a statistical outlier relative to the first component b and the transfer function T of the input device 52. So, in the case of the accelerometer or PGG sensor, the first component a may be the impulsive noise n and the second component b may be the input signal x. In the voice use case, the first component a may be the input signal x comprising speech, and the second component b may be the (substantially time-invariant) noise n. The signal y may be represented by the following equation.

$$y = aT + bT$$

The signal processing module 1600 comprises a Fourier transform module 1602 which converts the signal y into a frequency domain representation Y. For example, the Fourier transform module 1602 may implement a fast Fourier transform (FFT). In some embodiments, the audio signal y may be provided to the signal processing module 1600 in the frequency domain, in which case the Fourier transform module 1600 may be omitted.

The signal processing module 1600 further comprises an order-statistic filter module 1604 configured to filter the frequency domain representation Y of the audio signal y to generate an approximation of the second component b and the transfer function T of the input device 52. i.e., the output of the order-statistic filter module 1604 in each frequency band may be defined as follows:

$$\theta(y) \approx bT$$

This approximation of bT can then be used to design an equaliser to remove both the first component a and the transfer function T from the signal Y, leaving substantially the second component b, as will be described in more detail below.

Optionally, the order statistic filter module 1604 may be configured to filter the frequency domain representation Y of the audio signal y using a trained neural network. For example, the neural network may be trained with data related to the input signal x.

Optionally, the signal processing module 1600 comprises a smoothing module 1606 configured to smooth the filtered power spectrum θ(Y). The smoothing module 1606 may implement a moving average filter or a Savitsky-Golay filter, or a Kalman filter to name a few examples.

The signal processing module 1600 further comprises an equalisation module 1608 configured to apply equalisation (EQ) to the frequency domain representation Y of the audio signal y. The statistically filtered power spectrum θ(Y), smoothed or otherwise, is also provided as an input to the equalisation module 1608. The equalisation module 1608 may be configured to tune a series of equalisation parameters based on the received statistically filtered power spectrum θ(Y). The equalisation module 1608 may therefore be configured to apply weights to respective frequency bins of the audio signal y. In some embodiments, the equalisation parameters are trained using machine learning. For example, a neural network may be trained based on the statistically filtered power spectrum θ(Y).

In the situation where the first component a (i.e. the statistical outlier) is impulsive noise n, the equalisation module 1608 may be configured to normalise a signal-to-noise ratio (SNR) across the frequency bins of the digital signal Y to obtain the second component b (i.e. the signal of interest) at the output. For example, the ratio of the second component b to the first component a may be defined as follows:

$$Y' = \frac{Y}{\theta(Y)} - 1 = \frac{bT + aT}{bT} - 1 = \frac{a}{b}$$

With the first component a being noise n and the second component b being the input signal, the above equation represents a measure of noise-to-signal ratio (NSR). The equaliser may use Y' to generate equalisation parameters to normalise SNR such that each frequency bin of a normalised signal comprises comparable information, substantially absent of the effects of impulsive noise. For example, the scaling factor b/a may be applied to each bin to ensure that the SNR of the signal Y(eq) output from the signal processing module 1600 is substantially constant over time. This may be approximated to the ratio of the order statistic filtered signal $\theta(Y)$ to the signal Y.

It will be appreciated that in the above technique, where the signal to be removed is impulsive noise, the resultant signal may still be affected by time invariant (e.g. Gaussian) noise. However, such noise can be easily removed with known signal processing techniques, such as using a Kalman filter or similar.

The order-statistic filter module 1602 may implement any known order-statistic filter to provide an estimate of the product of the second component b and the transfer function T, i.e. bT. Examples of such order-statistic filters are described at length above with reference to FIG. 4.

The skilled person will recognise that some aspects of the above-described apparatus and methods may be embodied as processor control code, for example on a non-volatile carrier medium such as a disk, CD- or DVD-ROM, programmed memory such as read only memory (Firmware), or on a data carrier such as an optical or electrical signal carrier. For many applications embodiments of the invention will be implemented on a DSP (Digital Signal Processor), ASIC (Application Specific Integrated Circuit) or FPGA (Field Programmable Gate Array). Thus, the code may comprise conventional program code or microcode or, for example code for setting up or controlling an ASIC or FPGA. The code may also comprise code for dynamically configuring re-configurable apparatus such as re-programmable logic gate arrays. Similarly, the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

Note that as used herein the term module shall be used to refer to a functional unit or block which may be implemented at least partly by dedicated hardware components such as custom defined circuitry and/or at least partly be implemented by one or more software processors or appropriate code running on a suitable general purpose processor or the like. A module may itself comprise other modules or functional units. A module may be provided by multiple components or sub-modules which need not be co-located and could be provided on different integrated circuits and/or running on different processors.

Embodiments may be implemented in a host device, especially a portable and/or battery powered host device such as a mobile computing device for example a laptop or tablet computer, a games console, a remote control device, a home automation controller or a domestic appliance including a domestic temperature or lighting control system, a toy, a machine such as a robot, an audio player, a video player, or a mobile telephone for example a smartphone.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. A method of equalising a signal derived from an input device, the method comprising:
   receiving the signal;
   applying an order-statistic filter directly to the signal in a frequency domain to generate a statistically filtered signal;
   equalising the received signal based on the statistically filtered signal to generate an equalised signal.

2. The method of claim 1, wherein equalising the signal comprises:
   setting an equalisation target of an equaliser to an inverse of the statistically filtered signal; and
   equalising the signal using the equaliser.

3. The method of claim 2, wherein equalising the audio signal comprises:
   identifying frequency bins of the statistically filtered signal having amplitudes greater than a threshold amplitude; and
   removing components from frequency bins of the signal corresponding to the identified frequency bins of the statistically filtered signal.

4. The method of claim 1, wherein equalising the signal comprises:
   setting an equalisation target of an equaliser to a ratio of the statistically filtered signal to the signal; and
   equalising the signal using the equaliser.

5. The method of claim 1, further comprising smoothing the statistically filtered signal to generate a smoothed statistically filtered signal, wherein the equalising comprises equalising the smoothed statistically filtered signal.

6. The method of claim 5, wherein the smoothing is performed using a moving average filter or a Savitsky-Golay filter.

7. The method of claim 6, further comprising:
   applying a threshold to the difference between the statistically filtered signal and the smooth statistically filtered signal to identify frequency bins in the statistically filtered signal having amplitudes exceeding the threshold;
   wherein the equalising comprises removing or suppressing components of frequency bins of the signal corresponding to the identified frequency bins in the statistically filtered signal.

8. The method of claim 1, wherein the order-statistic filter comprises one of:
   a) a median filter;
   b) a percentile filter;
   c) a minimum filter;
   d) a trimmed mean filter; and
   e) a trimmed minimum filter.

9. The method of claim 8, wherein the median filter is a recursive median filter or wherein the percentile filter is a recursive percentile filter.

10. The method of claim 1, wherein the order-statistic filter is applied to the entire signal.

11. The method of claim 1, wherein the order-statistic filter is applied to a subset of frequency bins of the signal.

12. The method of claim 11, wherein a frequency range of the subset of frequency bins spans a frequency of an artefact in the signal.

13. The method of claim 1, further comprising:
    determining a discrete Fourier transform of the signal;
    wherein applying an order-statistic filter to the signal in the frequency domain comprises applying the order-statistic filter to the discrete Fourier transform of the signal.

14. The method of claim 13, wherein equalising the received signal comprises applying weights to frequency bins of the discrete Fourier transform.

15. The method of claim 1, wherein the steps of applying the order-statistic filter and/or equalising the received signal are implemented using a trained neural network.

16. The method of claim 1, wherein one of the following applies:
    a) the input device comprises a microphone and the signal comprises an audio signal;
    b) the input device comprises a photodetector and the signal represents light incident the photodetector;
    c) the input device comprises an accelerometer and the signal comprises an accelerometer signal.

17. A method of equalising a signal, comprising:
    determining a discrete Fourier transform for the signal;
    determine a median value for each frequency bin of the discrete Fourier transform;
    smoothing the median values over a frequency range of the discrete Fourier transform;
    inverting the smoothed median values; and
    applying a weight to each frequency bin of the discrete Fourier transform based on a corresponding one of the inverted smooth median values.

18. The method of claim 17, wherein the discrete Fourier transform is a fast Fourier transform (FFT).

19. A system for equalising a signal derived from an input device, the system comprising:
    an input for receiving the signal;
    one or more processors configured to:
    apply an order-statistic filter directly to the signal in a frequency domain to generate a statistically filtered audio signal;
    equalise the signal based on the statistically filtered signal to generate an equalised signal.

20. An electronic device comprising the system of claim 19.

21. The electronic device of claim 20, wherein the device comprises one of a smartphone, a tablet, a laptop computer, a games console, a home control system, a home entertainment system, an in-vehicle entertainment system, and a domestic appliance.

22. A non-transitory computer readable storage medium having computer-executable instructions stored thereon that, when executed by one or more processors, cause the one or more processors to perform a method of equalising a signal derived from an input device, the method comprising:
    receiving the signal;
    applying an order-statistic filter directly to the signal in a frequency domain to generate a statistically filtered signal; and
    equalising the received signal based on the statistically filtered signal to generate an equalised signal.

* * * * *